(12) United States Patent
Ferrant et al.

(10) Patent No.: US 7,161,863 B2
(45) Date of Patent: Jan. 9, 2007

(54) DRAM REFRESHMENT

(75) Inventors: Richard Ferrant, Crolles (FR); François Jacquet, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 404 days.

(21) Appl. No.: 10/627,955

(22) Filed: Jul. 25, 2003
(Under 37 CFR 1.47)

(65) Prior Publication Data
US 2005/0157534 A1    Jul. 21, 2005

Related U.S. Application Data

(63) Continuation of application No. 10/337,215, filed on Jan. 6, 2003, now abandoned, which is a continuation of application No. 10/210,864, filed on Aug. 1, 2002, now abandoned, which is a continuation of application No. 10/033,384, filed on Dec. 28, 2001, now abandoned.

(30) Foreign Application Priority Data

Dec. 29, 2000  (FR)  .................................. 00 17294

(51) Int. Cl.
*G11C 7/00*   (2006.01)
(52) U.S. Cl. .................. 365/222; 365/205; 365/207
(58) Field of Classification Search ................ 365/149, 365/205, 207, 222
See application file for complete search history.

(56) References Cited

U.S. PATENT DOCUMENTS

| | | | | |
|---|---|---|---|---|
| 5,537,359 A | * | 7/1996 | Toda | ............................ 365/222 |
| 5,590,080 A | * | 12/1996 | Hasagawa et al. | ............ 365/201 |
| 5,822,264 A | * | 10/1998 | Tomishima et al. | .......... 365/222 |
| 5,822,266 A | * | 10/1998 | Kikinis | ........................ 365/222 |
| 5,995,433 A | | 11/1999 | Liao | |
| 6,075,736 A | * | 6/2000 | Kim et al. | .................... 365/207 |
| 6,097,658 A | | 8/2000 | Satoh et al. | |
| 6,515,930 B1 | * | 2/2003 | Jacquet et al. | ............... 365/222 |
| 6,801,467 B1 | * | 10/2004 | Ferrant et al. | ............... 365/222 |

OTHER PUBLICATIONS

French Search Report from French Patent Application No. 00/17294, filed Dec. 29, 2000.

* cited by examiner

*Primary Examiner*—Ahn Phung
*Assistant Examiner*—Hien N Nguyen
(74) *Attorney, Agent, or Firm*—Lisa K. Jorgenson; James H. Morris; Wolf, Greenfield & Sacks, P.C.

(57) ABSTRACT

A DRAM including an array of storage elements arranged in lines and columns, and for each column: write means adapted to biasing at least a selected one of the elements to a charge level chosen from among a first predetermined high level and a second predetermined low level, combined with read circuitry adapted to determining whether the stored charge level is greater or smaller than a predetermined charge level; and isolation circuitry adapted to isolating the array from the read and/or write means, each column further including refreshment means, distinct from the read and write circuit, for increasing, beyond the first and second predetermined levels, the charge stored in a storage element.

10 Claims, 4 Drawing Sheets

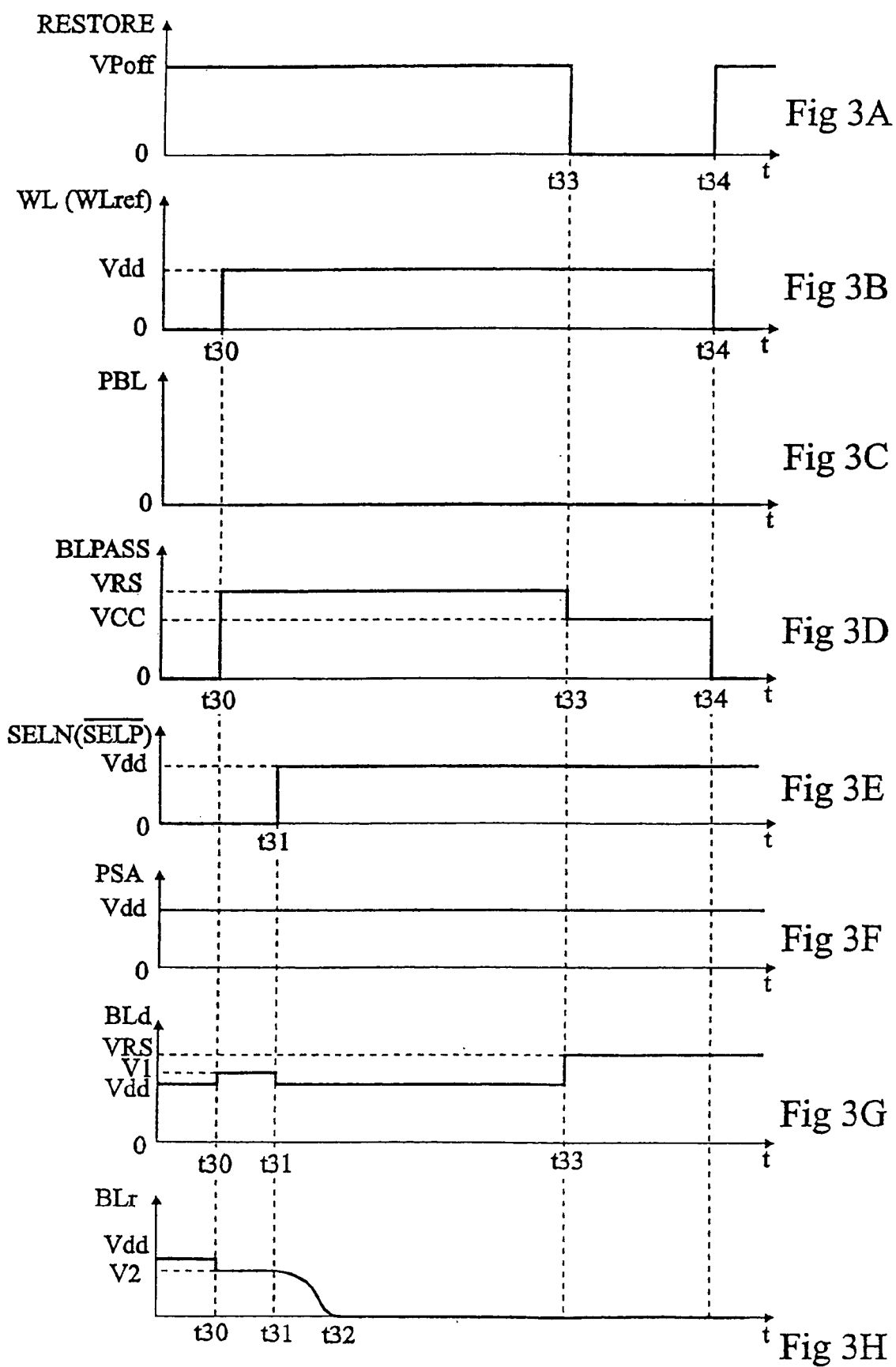

DRAM REFRESHMENT

CROSS REFERENCE TO THE RELATED APPLICATIONS

This application is a continuation of prior application Ser. No. 10/337,215, filed Jan. 6, 2003 now abandoned, which in turn is a continuation of prior application Ser. No. 10/210,864, filed on Aug. 1, 2002 now abandoned which in turn is a continuation prior application Ser. No. 10/033,384, filed on Dec. 28, 2001 now abandoned entitled DRAM REFRESHMENT.

BACKGROUND OF THE INVENTION

1. Field of the Invention

The present invention relates to forming, in integrated form, memory devices. More specifically, the present invention relates to forming DRAMs, that is, memories requiring periodic refreshment.

2. Discussion of the Related Art

The increase in DRAM densities leads to forming control elements (generally MOS transistors) of memory points (capacitors) of more and more reduced dimensions (surface areas). This reduction in dimensions goes along with a reduction of the voltage levels that these elements can tolerate.

Accordingly, the use of DRAM memory point control transistors having reduced surface areas leads to reducing the charge levels stored in these memory points. Such a reduction makes the discrimination more difficult, at the level of sense amplifiers associated with the memory, between the states of an addressed storage element and of an associated reference storage element.

A first solution for overcoming this disadvantage would consist of increasing the responsiveness of sense amplifiers associated with the memory device to increase their accuracy until they are able to detect a level difference as small as approximately 50 mV. However, implementing such a solution means forming sense amplifiers including a greater and greater number of transistors, the thresholds of which must be set more and more accurately. Independently from the complications of the memory device integration process, the increase in the number of transistors forming such accurate sense amplifiers considerably reduces the advantages provided by the reduction of the characteristic dimensions of the control transistors of the storage elements of a DRAM.

SUMMARY OF THE INVENTION

The present invention aims at providing a novel type of DRAM device that can be made in integrated form with minimum dimensions, and in which the stored voltage levels are adapted to being discriminated by a standard sense amplifier.

To achieve these and other objects, the present invention provides a DRAM including an array of storage elements arranged in lines and columns, and for each column:

write means adapted to biasing at least a selected one of the elements to a charge level chosen from among a first predetermined high level and a second predetermined low level, combined with read means adapted to determining whether the stored charge level is greater or smaller than a predetermined charge level; and an isolation means adapted to isolating the array from the read and/or write means, each column further including refreshment means, distinct from the read and write means, for increasing, beyond the first and second predetermined levels, the charge stored in a storage element.

According to an embodiment of the present invention, the refreshment means is formed of a P-channel dual-gate MOS transistor, interposed between a high supply rail and a node of interconnection of drains of two P-channel dual-gate MOS transistors, the sources of which form input/output terminals, each of which is connected to the gate of the other transistor.

According to an embodiment of the present invention, the isolation means includes, interposed between each output of the array and one of the input/output terminals of the read-write means, an N-channel dual-gate MOS transistor.

According to an embodiment of the present invention, each column also includes a stage for precharging the array.

According to an embodiment of the present invention, the precharge stage includes, interposed between each output of the network and a precharge supply source, an N-channel dual-gate MOS transistor.

According to an embodiment of the present invention, each column also includes a stage of precharge and balancing of the read means.

According to an embodiment of the present invention, the precharge and balancing stage includes, interposed between two read terminals of the read means, three MOS transistors of the same type with a common gate, two first ones of which are series-connected between the read terminals, their common point being connected to a precharge supply source, and the last one of which directly short-circuits the read terminals.

The present invention also provides a method for writing a datum into a memory according to any of the preceding embodiments, including the step of biasing the isolation means so that it is partially open, and enabling the refreshment means.

According to an embodiment of the present invention, the method includes the step of biasing the isolation means so that it is completely open, and enabling the refreshment means.

According to an embodiment of the present invention, the method includes providing, for the isolating means, a three-level control signal, a first level completely activating the isolation means, a second low level completely inhibiting the isolation means, and a third level being adapted to activating or inhibiting each N-channel dual-gate MOS transistor according to the state of the input/output terminal of the read-write means associated therewith.

The foregoing objects, features and advantages of the present invention, will be discussed in detail in the following non-limiting description of specific embodiments in connection with the accompanying drawings.

BRIEF DESCRIPTION OF THE DRAWINGS

FIG. 3A–3L illustrates the variation with time of control and output signals at certain nodes of the circuit of FIG. 1 during the reading of a datum.

DETAILED DESCRIPTION

The same elements have been designated with the same references in the different drawings. For clarity, the waveforms illustrated in FIGS. 2 and/or 3 have been designated by the name of the lines conveying them in FIG. 1. Further, only those elements necessary to the understanding of the present invention have been shown and will be described hereafter. In particular, the structures and operations of the different control circuits of the memory have not been detailed and are no object of the present invention. Similarly, the operation and exploitation of the input/output signals of a DRAM will be considered as known and will not be detailed hereafter.

Figure 1:
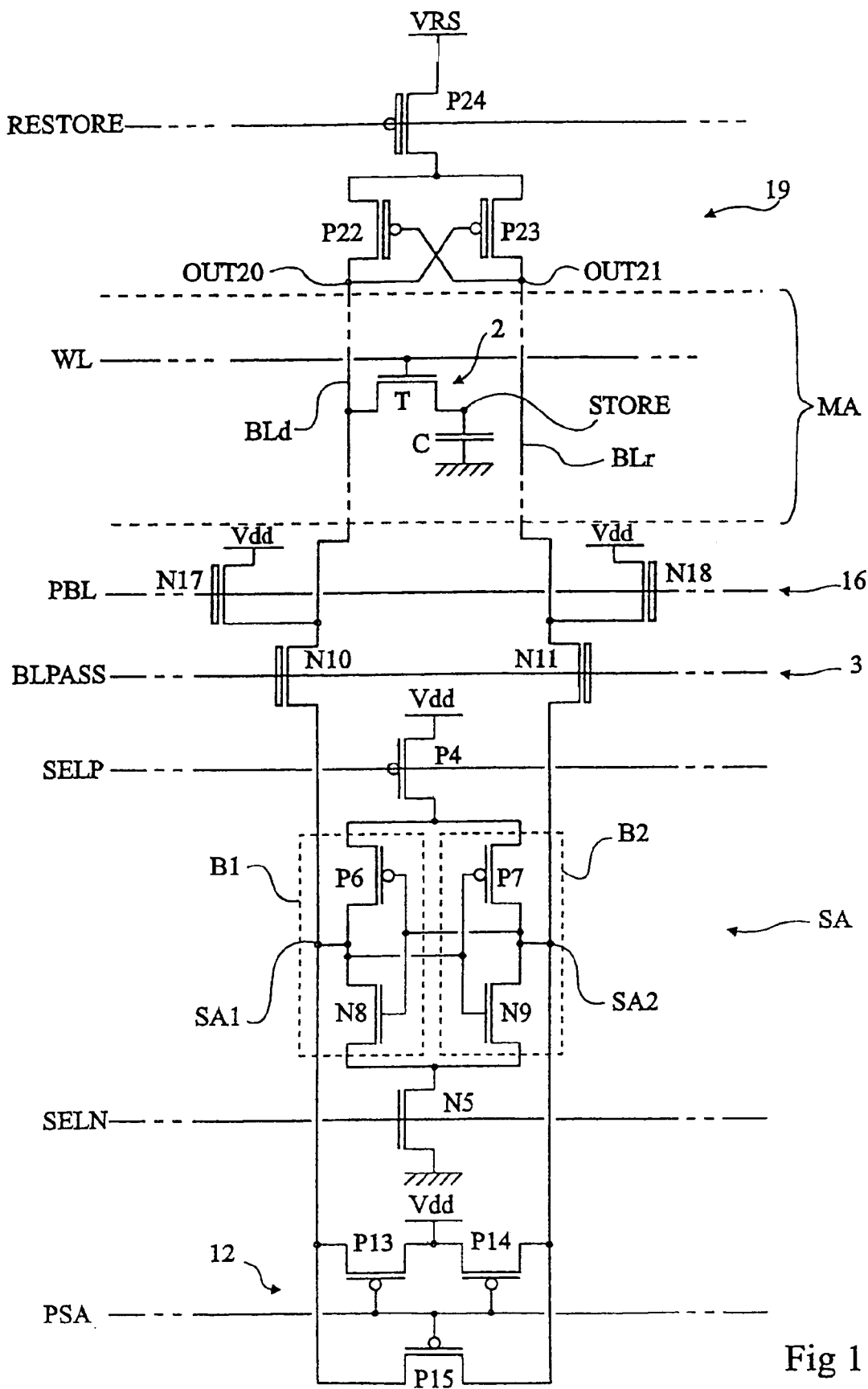
FIG. 1 schematically and partially illustrates a column of a memory device according to the present invention.

FIG. 1 schematically and partially illustrates a column of a DRAM device according to the present invention. The column includes an array MA of storage elements 2. Storage elements 2 are distributed in array MA at the intersection of lines and columns. Each column includes two bit lines, one direct bit line BLd and one reference bit line BLr, shown vertically. Each element 2 is formed of the series connection, between a bit line BLd and a low supply rail or circuit ground, of a control transistor T, for example with an N channel, and of a capacitor C. The junction point of transistor T and capacitor C forms memory point STORE. The gate of transistor T is connected to a word line WL of array MA, shown horizontally. Each column is associated with at least one reference element (not shown) formed, like element 2, of a control transistor and of a capacitor connected similarly to those of element 2, but between reference bit line BLr of the same column and a word line (not shown) distinct from line WL. The reference element is associated with a reference memory point STOREref (not shown in FIG. 1).

Each column of array MA is associated with a read amplifier SA. More specifically, direct bit line BLd is connected to a first read terminal SA1 of amplifier SA via an isolation and transfer stage 3. Similarly, reference bit line BLr is connected to a second read terminal SA2 of read amplifier SA via isolation and transfer stage 3. Read amplifier SA is bidirectional and is also used in the writing.

Each amplifier SA is formed of the series connection, between a first high supply rail Vdd and the circuit ground, of two complementary MOS selection transistors P4 and N5, respectively with a P channel and with an N channel, between which is interposed a parallel association of two identical branches B1 and B2. Each branch B1 and B2 includes, connected in series, a P-channel MOS transistor P6, respectively P7, and an N-channel MOS transistor N8, respectively N9. The common point of transistors P6 and N8 of first branch B1 forms first read terminal SA1. The common point of transistors P7 and N9 of second branch B2 forms second read terminal SA2. The gates of complementary transistors P6 and N8 of branch B1 are interconnected and connected to terminal SA2. The gates of transistors P7 and N9 of branch B2 are interconnected and connected to terminal SA1. The drains of transistors P6 and P7 are connected to the source of transistor P4. The sources of transistors N8 and N9 are interconnected to the drain of transistor N5. Transistors P6, P7, N8 and N9 form two inverters in antiparallel between read terminals SA1 and SA2. The gates of selection transistors P4 and N5 are driven by respective enable signals SELP and SELN. The structure of amplifier SA and of selection elements P4 and N5 is conventional.

According to the present invention, isolation and transfer stage 3 is formed of dual-gate N-channel MOS transistors N10, N11. Transistors N10 and N11 receive on their respective gate a same data transfer control signal BLPASS. The drains of transistors N10 and N11 are respectively connected to the end of one of bit lines BLd and BLr. Their sources are connected to one of read terminals SA1, SA2 of read amplifier SA, respectively.

A feature of the present invention is that signal BLPASS is chosen so that, when active (high level), its level is such that one of transistors N10 or N11 is off while the other transistor N11 or N10 is on, according to the state of the read terminals with which they are respectively associated. This feature will better appear from the description of FIG. 3.

Read amplifier SA is associated with a conventional precharge and balancing stage 12 formed of three P-channel MOS transistors P13, P14, and P15 with common gates. Transistors P13 and P14 are series-connected between terminals SA1 and SA2. The junction point of transistors P13 and P14 is connected to supply rail Vdd. Transistor P15 directly short-circuits terminals SA1 and SA2. The common gate of transistors P13, P14, and P15 receives a precharge control signal PSA.

Direct bit line BLd and reference bit line BLr are also connected to a precharge device 16. According to the present invention, device 16 includes a dual-gate N-channel MOS transistor N17 or N18, interposed between high supply rail Vdd and the end of bit line BLd or BLr at the output of array MA. Precharge stage 16 is interposed between array MA and transfer stage 3. The source of precharge transistor N17, N18 of each bit line BLd, BLr is thus connected to the drain of the corresponding transfer transistor N10, N11. The gates of transistors N17, N18 are interconnected and receive a same bit line precharge control signal PBL.

According to the present invention, a column of a DRAM-type memory device further includes a refreshment stage 19. Stage 19 includes two input/output terminals OUT20 and OUT21 respectively connected to one end of one of bit lines BLd and BLr of the considered column. The involved end of the bit lines is that opposite to that connected to bit line precharge stage 16 and transfer stage 3. Terminal OUT20, associated with line BLd, is the source of a dual-gate P-channel MOS transistor P22. Terminal OUT21, associated with line BLr, is the source of a dual-gate P-channel MOS transistor P23. Terminal OUT20 is also connected to the gate of transistor P23. Terminal OUT21 is also connected to the gate of transistor P22. The drains of transistors P22 and P23 are interconnected to the source of a dual-gate P-channel transistor P24 for controlling refreshment stage 19.

The drain of transistor P24 is connected to a second high supply rail VRS, the voltage level of which is, according to the present invention, greater than the write levels of storage elements 2 and to the precharge level of amplifier SA. In the considered case, the highest write level and the precharge level of amplifier SA are equal to the voltage of first high supply rail VRS. The gate of transistor P24 receives a refreshment control signal RESTORE.

Figures 2A, 2B, 2C, 2D, 2E, 2F, 2G, 2H, 2I, 2J:
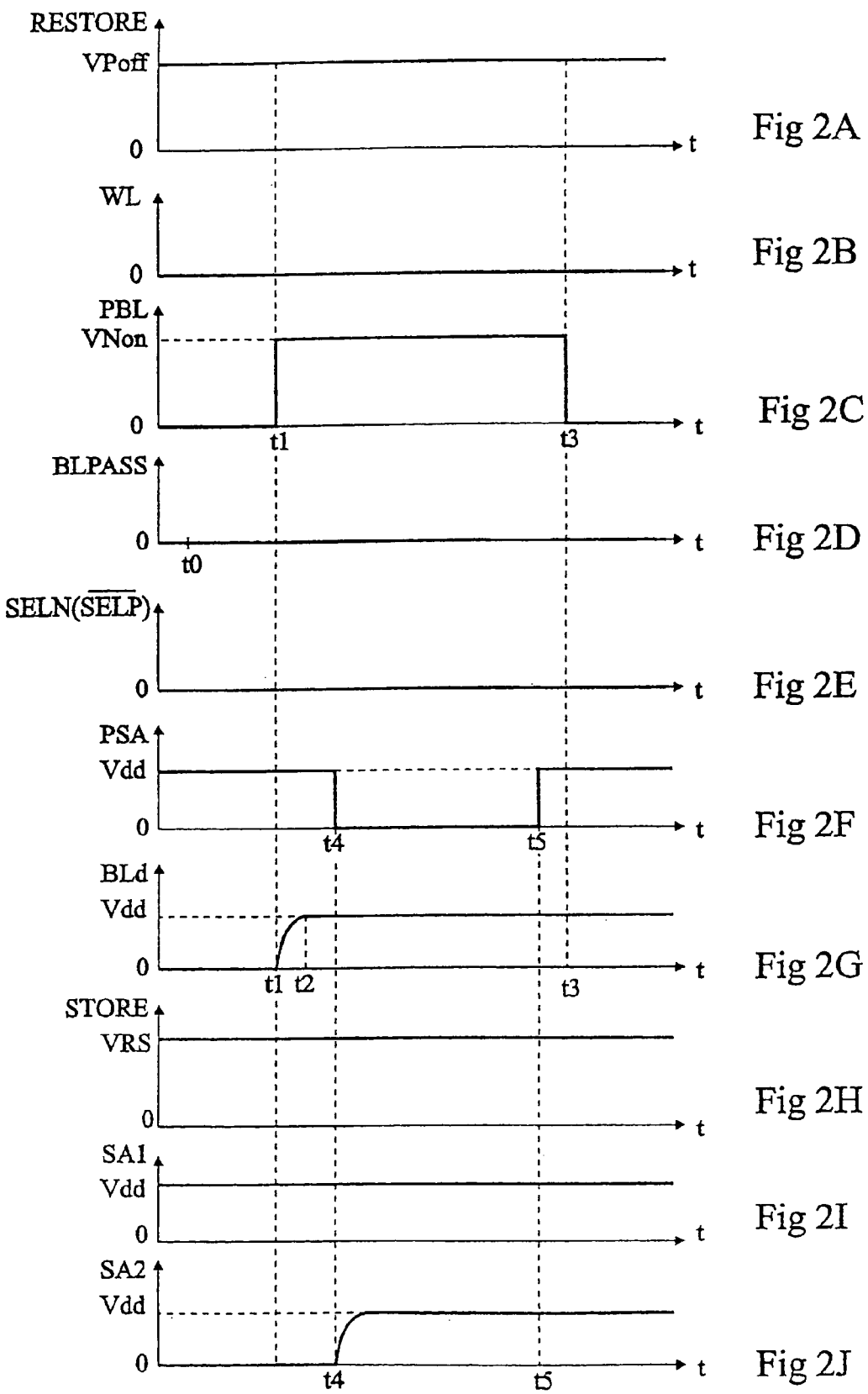
FIG. 2A–2J illustrates the variation in time of control and output signals at certain nodes of the circuit of FIG. 1 during precharge operations.

The operation of a memory device according to the present invention will be explained hereafter in relation with FIG. 2, which illustrates the variation along time of various control and/or output signals of a dynamic memory according to the present invention, in an operation of precharge of a storage element 2 (FIG. 1) or of read terminals SA1 and SA2. FIGS. 2A, 2B, 2C, 2D, 2E, and 2F respectively show control signals RESTORE, WL, PBL, BLPASS, SELN ($\overline{\text{SELP}}$), and PSA. FIGS. 2G to 2J illustrate the voltage variations along time, respectively, on line BLd, at point STORE, and on terminals SA1 and SA2.

A precharge of a direct bit line BLd (FIG. 1) of a given column and of the associated reference bit line may occur, for example, before any write operation of a datum into this element 2. The precharge starts by isolating network MA from amplifier SA. For this purpose, isolation control signal BLPASS is, according to its initial state, brought to or maintained at zero at a time to (FIG. 2D). Transistors N10 and N11 are then both off, provided that the levels of points SA1 and SA2 are higher than −Vt, where Vt represents the threshold voltage of transistors N10 and N11. This condition can always be respected by properly choosing the precharge levels. Cells 2 are isolated from the direct and indirect bit lines by maintaining their control transistor open. At a time t1, transistors N17 and N18 of precharge stage 16 are turned on by bringing to its highest voltage level VNon precharge signal PBL (FIG. 2C). Then, direct bit line BLd (FIG. 2G) and point STORE (FIG. 2H) bias to the voltage level of precharge transistor N17, for example, Vdd, which is reached at a time t2. Similarly, reference bit line BLr is precharged to the level set by the supply of precharge transistor N18, preferably identical to the supply level of transistor N17, for example, Vdd. In such a precharge, refreshment stage 19 is disabled. Indeed, refreshment control signal RESTORE (FIG. 2A) is maintained at the high state VPoff, thus guaranteeing the off state of transistor P24. On the other hand, the relatively high precharge voltage levels of bit lines BLd and BLr are transmitted to terminals OUT20 and OUT21, that is, onto the gates of P-channel transistors P22 and P23. These transistors are then controlled to be turned off. After time t2 of level stabilization on bit line BLd (and BLr), precharge signal PBL is switched at time t3 to disable precharge stage 16.

A precharge of read terminals SA1 and SA2 of read amplifier SA is necessary before a read operation of data stored in any of elements 2 of network MA. In such a precharge, network MA must be isolated from amplifier SA. This condition being fulfilled in FIG. 2, the operation of precharge of amplifier SA will be described hereafter in relation with FIGS. 2D, 2F, 2I, and 2J. The isolation between network MA and amplifier SA being ensured at time t0 by a low state of signal BLPASS, transistors P13, P14, and P15 of stage 12 are controlled to be turned on by a switching of signal PSA (FIG. 2F) at a time t4. Transistors P13 and P14 then copy on terminals SA1 (FIG. 2I) and SA2 (FIG. 2J) the voltage level set at their common point, for example, level Vdd. The voltage levels of points SA1 and SA2 are balanced by transistor P15. The precharge of terminals SA1 and SA2 ends after stabilization at a subsequent time t5 by the disabling of stage 12.

Those skilled in the art should understand that the foregoing description of operations of precharge of the bit lines and of the amplifier in relation with the same FIG. 2 implies no synchronization between the two operations. Such a description has been made as a non-limiting example only, since the precharges are both performed while network MA is isolated from amplifier SA, that is, when signal BLPASS is low. Any other operation could however be performed on array MA during a precharge of read amplifier SA, such as, for example, a refreshment, requiring isolation between network MA and amplifier SA. Conversely, during a precharge of one or several of storage elements 2 of array MA, any operation such as, for example, the loading on terminals SA1 and SA2 of data to be transferred to network MA, imposing an isolation between network MA and amplifier SA, could be performed.

Successive read and refresh operations of a datum contained in a storage element 2 will be detailed hereafter in relation with FIG. 3, which illustrates the variation along time of various control and/or output signals of a dynamic memory according to the present invention. FIG. 3A shows signal RESTORE. FIG. 3B shows signal WL. FIG. 3C shows signal PBL. FIG. 3D shows signal BLPASS. FIG. 3E shows signal SELN ($\overline{SELP}$). FIG. 3F shows signal PSA. FIGS. 3G ad 3H illustrate the variations along time, respectively, on direct bit line BLd and reference bit lines BLr. FIGS. 3I and 3J illustrate the voltage variation along time, respectively, on storage nodes STORE and STOREref. FIGS. 3K and 3L illustrate the voltage variations along time, respectively, on terminals SA1 and SA2.

Figure 3I:
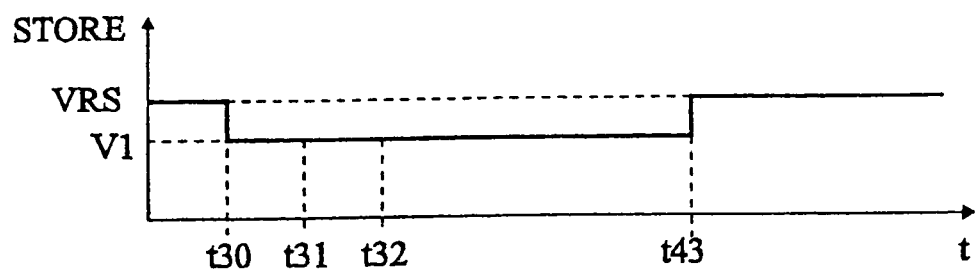
Figure 3J:
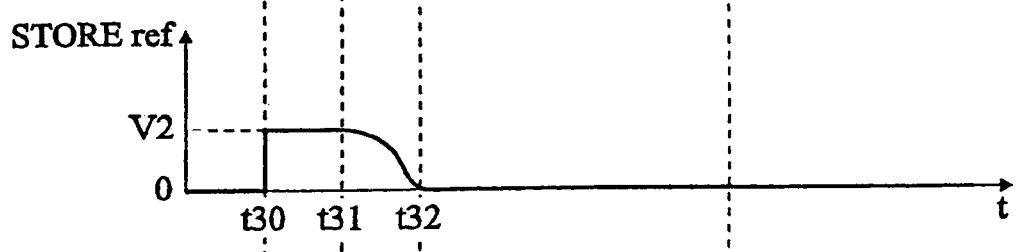
Figure 3K:
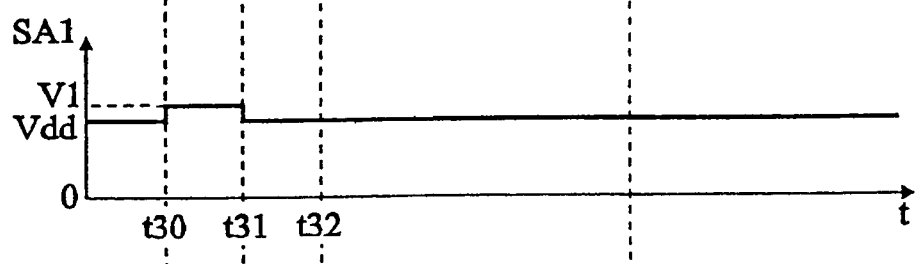
Figure 3L:
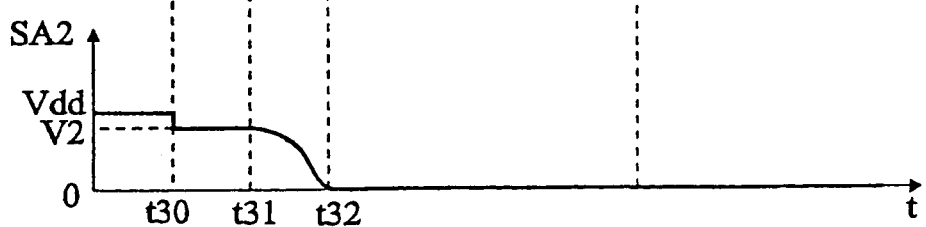

A read operation occurs after an operation of precharge of bit lines BLd and BLr and of terminals SA1 and SA2. For simplification, as illustrated in FIGS. 3G, 3H, 3K, and 3L, it is considered, as previously, that the different precharge levels are equal and equal to a first high write supply Vdd. These precharge states being stabilized, a read operation is performed while stages 12 of precharge of terminals SA1 and SA2, and 16 of precharge of lines BLd, BLr, respectively, are disabled by the maintaining of signals PSA (FIG. 3F) and PBL (FIG. 3C) at respective high (for example, Vdd) and low (for example, 0) states. These conditions being fulfilled, a read operation starts at a time t30 by the selection of storage element 2 and of the associated reference element by the turning-on of their respective control transistors T (that is, the switching to a relatively high state, for example Vdd, of their respective control signals WL and WLref, FIG. 3B). Simultaneously, transfer stage 3 is made completely conductive by the switching to its highest state VRS of signal BLPASS (FIG. 3D). Then, the voltage levels on terminals SA1 and SA2 tend to balance with the levels of the storage elements. In practice, it is assumed that storage element 2 contains a datum "1". Point STORE then is at its highest voltage level VRS (FIG. 3I). Anti-symmetrically, it is assumed that the reference storage element contains a datum "0". Storage point STOREref then initially is at a null voltage level. At time t30, the voltage levels on bit line BLd and at point STORE tend towards a relatively high voltage level V1, between VRS and Vdd. Anti-symmetrically, reference bit line BLr, terminal SA2 and reference storage point STOREref tend to balance at a voltage level V2 at most equal to Vdd. Indeed, on the direct bit line side, the charges must balance between a point at voltage VRS and a point at voltage Vdd. However, on reference bit line BLr, they need to balance between a point at a null voltage and a point at a voltage Vdd. There then appears between terminals SA1 and SA2 a voltage difference ΔV equal to the difference existing between voltages V1 and V2. At a time t31, read amplifier SA is enabled by an appropriate switching of its selection signals SELN and SELP (FIG. 3E). Voltage difference ΔV is then amplified by amplifier SA. The relatively high and null voltage states thus reached by terminals SA1 and SA2 then correspond to the levels initially stored respectively in the storage and reference elements.

According to the present invention, such a read operation is followed by an operation of refreshment of datum "1". For this purpose, the following is performed. Once the read levels have been reached, isolation and transfer stage 3 is partially unbalanced at a time t33, by a control signal BLPASS at a level (for example, Vcc) lower than the high turn-on level VNon of this stage.

In fact, voltage Vcc is chosen to be lower than the high level (for example, Vdd) of a read terminal, plus threshold voltage Vt of transistors N10 and N11. Advantage is then taken from the fact the transistors N10 and N11 having an N channel, they let through the levels which are lower than the level of their gate voltage minus their threshold voltage. If the read terminal (for example, SA1) is high, the corresponding transistor (for example, N10) of isolation stage 3 is off. If the read terminal (for example, SA2) is low, the corresponding transistor (for example, N11) is on. Amplifier SA is thus partially isolated from network MA.

Refreshment stage 19 is then enabled by a transition from a high state to a low state of its control signal RESTORE (time t33). Refresh voltage Vcc for supplying refresh control transistor P24 is then transmitted over direct bit line BLd. The charge stored on memory node STORE is then increased, as illustrated in FIG. 31. Indeed, as discussed previously, level Vcc is higher than write level Vdd. Since transistor N11 is on, isolation stage 3 enables, from as soon as time t33 of switching of refresh control signal RESTORE, reference bit line BLr to be biased to the low level by the second terminal SA2 of read amplifier SA. Line BLr then transmits this low level onto the gate of P-channel transistor P22 of refreshment stage 19 connected to direct bit line BLd. Transistor P22 is then controlled to be turned on and output OUT20 of refreshment stage 19 copies refreshment voltage Vcc. The initial high state of direct bit line BLd is transmitted to the gate of transistor P23, which remains off and prevents transmission of refresh level VRS over reference bit line BLr. Such a transmission would cause a conflict of values at the level of read terminals SA1 and SA2, which would result in an undesirable oscillation of the levels in the circuit. Due to the turning-off of transistor N10, stage 3 isolates terminal SA1 from line BLd and thus avoids any conflict between levels VRS and Vdd. Accordingly, the sole datum "1" stored in element 2 has its voltage raised. Once this raised voltage level has stabilized at VRS, the refreshment of element 2 can be interrupted at a time t34 which also corresponds to the end of the reading, that is, to the deselection of the storage element and to the total closing of transfer stage 3, signals WL, WLref and BLPASS being brought down to 0.

A write operation is performed as follows. A write operation starts with the locking on input/output terminals SA1 and SA2 of read amplifier SA of the data to be written.

According to a first embodiment, a power write amplifier (not shown in FIG. 1) which imposes desired states on terminals SA1 and SA2 may be used for this locking.

According to a second embodiment, the amplifier terminals are precharged, as previously described in relation with FIG. 2, to a level Vdd. Then, a voltage imbalance between terminals SA1 and SA2 is created in the desired direction by means of an appropriate means not shown in FIG. 1. Read amplifier SA is then selected. Then, as described previously between times t33 and t34 (FIG. 3), the imbalance between terminals SA1 and SA2 is amplified.

Once these states have been locked, the data transfer is possible. For this purpose, as for a reading, storage element 2 and its corresponding reference element are simultaneously selected, while enabling transfer of the data by a switching to its highest state of signal BLPASS. Read amplifier SA being enabled, it controls the voltage levels at points STORE and STOREref. Once these levels have been stabilized, it is desirable to raise datum "1". For this purpose, as previously discussed, signal BLPASS is brought to a lower level, while stage RESTORE is enabled by a switching to the low state of signal RESTORE. Then, in the way previously described in relation with FIG. 3, high level Vdd of the cell containing datum "1", for example, cell 2, is raised to level VRS.

According to an alternative, the refresh operations can only be performed before a reading.

The control signals are then modified in any appropriate manner to allow for a next operation, for example, of deleting of element 2, that is, its return to a precharge state as previously described in relation with FIG. 2, or the preparation of a subsequent operation of refreshment of or rewriting into element 2, or its reading.

An advantage of the present invention is to replace relatively complex and bulky read amplifier devices by the combination of a standard read stage and of a refresh stage only formed of three additional transistors per column. According to the present invention, the difficulty for an amplifier with transistors of reduced surface area in discriminating the value of a high level stored in the read-addressed storage element or in the associated reference element is solved by a raising of this high level. In other words, while the writing is performed in a range at most limited to the voltage level of the first high supply rail Vdd, the reading is performed in a range ranging to the voltage level of the second high supply rail Vcc. Since the amplifier precharge is performed at most at the voltage level of the first high supply rail Vdd, by choosing a voltage level of second supply rail Vcc sufficiently greater than said first value, the discrimination is ensured.

The space gain and the simplification of memory device manufacturing methods widely compensates for the use of high-voltage dual-gate transistors, especially for transfer stage 3 and precharge stage 16, which must be able to stand in the off state a relatively high refreshment voltage VRS.

Of course, the present invention is likely to have various alterations, modifications, and improvements which will readily occur to those skilled in the art. In particular, the writing and the reading of a datum "1" has been previously described as a non-limiting example. However, those skilled in the art will be able to adapt the previously described control signals to the writing and/or the reading of a datum "0". More generally, based on the foregoing description of a few simple operations, those skilled in the art will know how to appropriately control each column of the memory device to obtain a desired behavior.

Further, those skilled in the art will know how to adapt the different control levels of the different stages to the principles and structures discussed in the foregoing description and to the desired functions. Those skilled in the art will also know how to minimize the number of necessary power supplies, especially by forming complementary MOS transistors, the highest turn-on or turn-off control levels VNon and VPoff of which are equal. Similarly, the different precharge levels of the bit lines or of the amplifier have been considered as being equal to the high write level set by first high supply rail Vdd. However, the precharge levels could be different, that is, lower, from this high write level.

Finally, the control levels will be adapted according to the principles discussed in the foregoing description and to the desired functions, according to the type of MOS switches used. For example, instead of being P-channel MOS transistors, the three transistors P13, P14, and P15 forming the precharge and balancing stage 12 of read amplifier SA may be three N-channel transistors, the corresponding control signal PSA then being the complementary of the previously described signal. More generally, transistors complementary to those used in the foregoing description may be used by correspondingly modifying their control signals.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A DRAM memory including an array of storage elements arranged in lines and columns, and for each column:
   write means capable of biasing at least a selected one of the elements to a charge level chosen from among a first predetermined high level and a second predetermined low level, combined with read means adapted to determining whether a stored charge level is greater or smaller than a predetermined charge level; and
   isolation means adapted to isolating the array from the read and/or write means,
   each column further including refreshment means, distinct from the read and write means, for increasing, beyond the first and second predetermined levels, the charge stored in a storage element.

2. The memory of claim 1, wherein said refreshment means are formed of a P-channel dual-gate MOS transistor, interposed between a high supply rail and a node of interconnection of drains of two P-channel dual-gate MOS transistors, sources of which form input/output terminals, each of which is connected to a gate of the other transistor.

3. The memory of claim 1, wherein said isolation means include, interposed between each output of the array and one of the input/output terminals of the read-write means, an N-channel dual-gate MOS transistor.

4. The memory of claim 1, wherein each column also includes a stage for precharging the array.

5. The memory of claim 4, wherein said precharge stage includes, interposed between each output of the network and a precharge supply source, an N-channel dual-gate MOS transistor.

6. The memory of claim 1, wherein each column also includes a stage for precharging and balancing the read means.

7. The memory of claim 6, wherein the precharging and balancing stage includes, interposed between two read terminals of the read means, three MOS transistors of the same type with a common gate, two first ones of which are series-connected between the read terminals, their common point being connected to a precharge supply source, and the last one directly short-circuitry the read terminals.

8. A method for writing a datum into the memory of claim 1, including the step of biasing the isolation means so that they are partially open, and enabling the refreshment means.

9. A method for writing a datum into the memory of claim 1, including the step of biasing the isolation means so that they are fully open, and enabling the refreshment means.

10. A method for controlling the memory of claim 3, including providing, for the isolating means, a three-level control signal, a first level completely activating the isolation means, a second low level completely inhibiting the isolation means and a third level being adapted to activating or inhibiting each N-channel dual-gate MOS transistor according to the state of the input/output terminal of the read-write means associated therewith.

* * * * *